US012635134B2

(12) United States Patent
Miao et al.

(10) Patent No.: US 12,635,134 B2
(45) Date of Patent: May 19, 2026

(54) MEMORY DEVICE AND FABRICATION METHOD THEREOF

(71) Applicant: Yangtze Memory Technologies Co., Ltd., Wuhan (CN)

(72) Inventors: Lina Miao, Wuhan (CN); Liang Xiao, Wuhan (CN); Yi Zhao, Wuhan (CN); Shu Wu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 505 days.

(21) Appl. No.: 18/082,153

(22) Filed: Dec. 15, 2022

(65) Prior Publication Data

US 2024/0179902 A1 May 30, 2024

(30) Foreign Application Priority Data

Nov. 24, 2022 (CN) ......................... 202211485187.X

(51) Int. Cl.
| | |
|---|---|
| *H10B 43/20* | (2023.01) |
| *H10D 30/69* | (2025.01) |
| *H10D 64/01* | (2025.01) |

(52) U.S. Cl.
CPC ........... *H10B 43/20* (2023.02); *H10D 30/693* (2025.01); *H10D 64/037* (2025.01)

(58) Field of Classification Search
CPC ........ H10B 43/20; H10B 41/27; H10B 43/27; H10D 30/693; H10D 64/037
See application file for complete search history.

(56) References Cited

U.S. PATENT DOCUMENTS

| | | | | |
|---|---|---|---|---|
| 9,230,984 | B1 * | 1/2016 | Takeguchi | H10B 41/27 |
| 10,847,539 | B2 * | 11/2020 | Wei | H10B 43/50 |
| 10,854,629 | B2 * | 12/2020 | Ge | H10B 43/40 |
| 12,256,544 | B2 * | 3/2025 | Watanabe | H10B 43/10 |
| 2015/0179660 | A1 * | 6/2015 | Yada | H10D 64/035 |
| | | | | 257/314 |
| 2016/0329340 | A1 * | 11/2016 | Hwang | H10B 43/40 |
| 2017/0103993 | A1 * | 4/2017 | Lee | H10B 43/35 |
| 2022/0093644 | A1 * | 3/2022 | Sharangpani | H10D 30/6891 |
| 2022/0149070 | A1 * | 5/2022 | Geng | H10B 43/35 |
| 2022/0157841 | A1 * | 5/2022 | Tsutsumi | G11C 7/18 |
| 2022/0157842 | A1 * | 5/2022 | Tsutsumi | H10B 43/35 |

(Continued)

*Primary Examiner* — Steven B Gauthier
*Assistant Examiner* — Khatib A Rahman
(74) *Attorney, Agent, or Firm* — Anova Law Group, PLLC

(57) ABSTRACT

A semiconductor device fabrication method includes providing a processing wafer. The processing wafer has core and staircase structure (SS) regions, and includes a bottom conductor layer, conductor/dielectric tier(s) over the bottom conductor layer, and a channel hole (CH) in the core region and extending approximately vertically through the conductor/dielectric tier(s). The CH includes a channel layer and a memory film surrounding the channel layer. A protrusion portion of the channel layer and a protrusion portion of the memory film extend into the bottom conductor layer. The method further includes patterning the bottom conductor layer to remove a portion of the bottom conductor layer in the core region to expose the protrusion portion of the memory film, performing etching to remove the protrusion portion of the memory film to expose the protrusion portion of the channel layer, performing impurity implantation, and performing laser activation.

20 Claims, 8 Drawing Sheets

(56)                    References Cited

U.S. PATENT DOCUMENTS

| | | | |
|---|---|---|---|
| 2022/0173040 A1* | 6/2022 | Wang | H01L 21/76895 |
| 2023/0169999 A1* | 6/2023 | Kim | G11C 5/025 |
| | | | 365/230.06 |
| 2023/0171957 A1* | 6/2023 | Zhou | H10B 41/27 |
| | | | 257/314 |
| 2023/0354608 A1* | 11/2023 | Nagahata | G11C 16/0483 |
| 2023/0402099 A1* | 12/2023 | Zhang | G11C 16/0483 |
| 2024/0029789 A1* | 1/2024 | Yang | H10B 41/27 |
| 2024/0107759 A1* | 3/2024 | Wu | H10B 43/27 |

* cited by examiner

700

800

MEMORY DEVICE AND FABRICATION METHOD THEREOF

CROSS-REFERENCE TO RELATED APPLICATION

This application claims the priority to Chinese Patent Application No. 202211485187.X, filed on Nov. 24, 2022, the content of which is incorporated herein by reference in its entirety.

FIELD OF THE TECHNOLOGY

This application relates to the field of semiconductor technology and, more particularly, to a memory device and fabrication method thereof.

BACKGROUND OF THE DISCLOSURE

Three-dimensional (3D) memory devices, such as 3D NAND memory devices, are promising memory devices with the potential of having a much higher storage density than conventional planar memories, and can meet the growing demands of consumer electronics, cloud computing, and big data for larger capacity and better performance. A 3D memory device usually includes multiple stack layers in a single chip to achieve a higher density, a higher capacity, a faster performance, a lower power consumption, and a better cost efficiency.

In a 3D memory device, a channel hole (CH) is formed penetrating through the multiple stack layers, with channel-forming materials filled in the channel hole to form a vertical channel. Other structures of memory cells are formed around the vertical channel so as to form a vertically oriented string of memory cells. During fabrication, various processing steps can be performed to improve the performance of the 3D memory device or to realize certain functions. Some processing steps may introduce certain problems and further optimization is needed.

SUMMARY

In accordance with the disclosure, there is provided a semiconductor device fabrication method including providing a processing wafer. The processing wafer has a core region and a staircase structure (SS) region next to each other. The processing wafer includes a bottom conductor layer, one or more conductor/dielectric tiers over the bottom conductor layer, and a channel hole (CH) in the core region and extending approximately vertically through the one or more conductor/dielectric tiers. The CH includes a channel layer extending approximately vertically and a memory film surrounding the channel layer. A protrusion portion of the channel layer and a protrusion portion of the memory film extend into the bottom conductor layer. The method further includes patterning the bottom conductor layer to remove a portion of the bottom conductor layer in the core region to expose the protrusion portion of the memory film, performing etching to remove the protrusion portion of the memory film to expose the protrusion portion of the channel layer, performing impurity implantation on the processing wafer, and performing laser activation on the processing wafer.

Also in accordance with the disclosure, there is provided a semiconductor device including a substrate, one or more conductor/dielectric tiers over the substrate, a conductive film over the one or more conductor/dielectric tiers, and a channel hole (CH) in the core region and extending approximately vertically through the one or more conductor/dielectric tiers. A thickness of the conductive film in a core region of the semiconductor device is smaller than a thickness of the conductive film in a staircase structure (SS) region of the semiconductor device. The CH includes a channel layer and a memory film. The channel layer extends approximately vertically and includes a first portion in the one or more conductor/dielectric tiers and a second portion in the conductive film. The memory film covers a sidewall of the first portion of the channel layer.

Also in accordance with the disclosure, there is provided a memory system including a memory device and a memory controller configured to control operation of the memory device. The memory device includes a substrate, one or more conductor/dielectric tiers over the substrate, a conductive film over the one or more conductor/dielectric tiers, and a channel hole (CH) in the core region and extending approximately vertically through the one or more conductor/dielectric tiers. A thickness of the conductive film in a core region of the semiconductor device is smaller than a thickness of the conductive film in a staircase structure (SS) region of the semiconductor device. The CH includes a channel layer and a memory film. The channel layer extends approximately vertically and includes a first portion in the one or more conductor/dielectric tiers and a second portion in the conductive film. The memory film covers a sidewall of the first portion of the channel layer.

DESCRIPTION OF EMBODIMENTS

Figure 1:
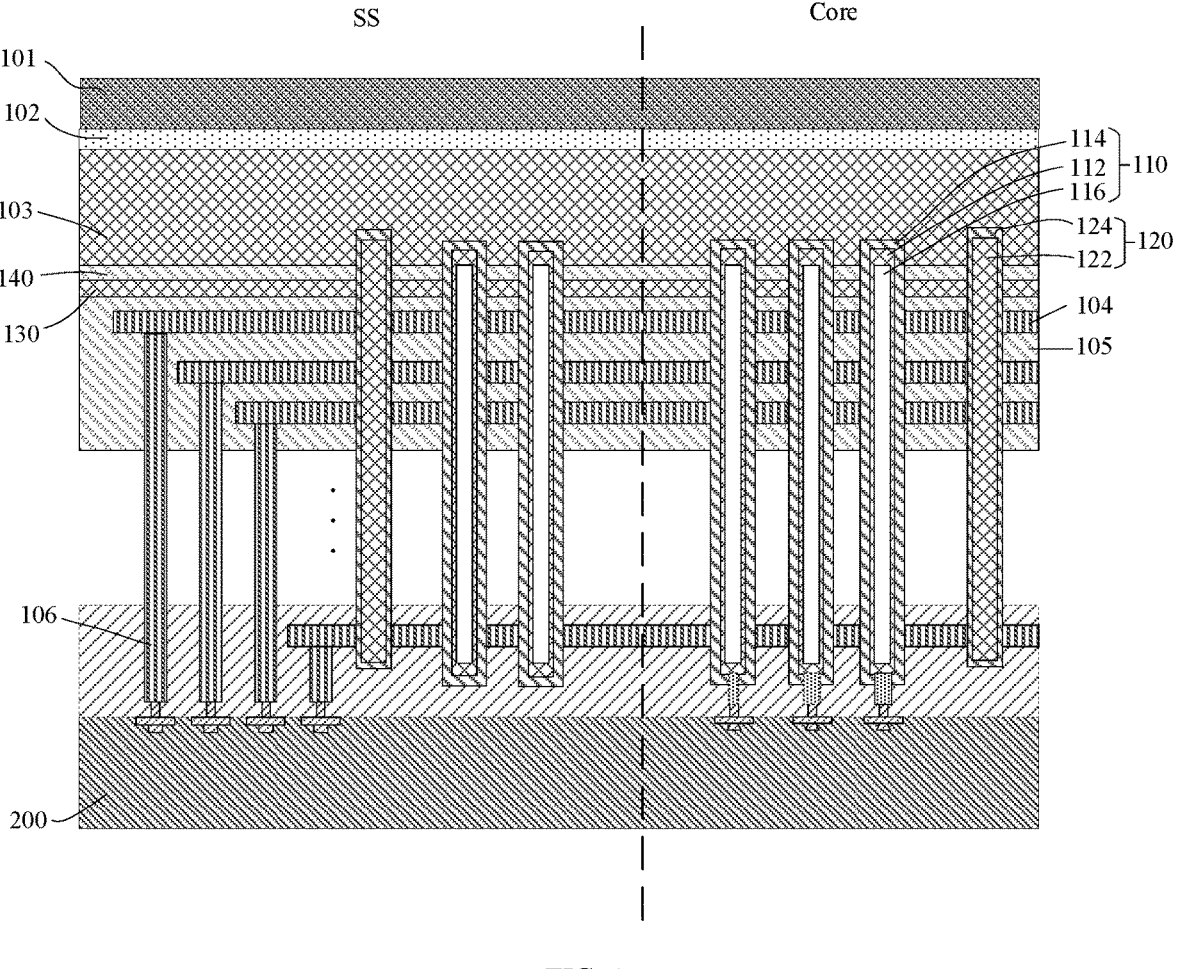
FIG. 1 is a schematical cross-sectional diagram showing a certain stage of a method of fabricating a semiconductor device consistent with the disclosure.

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

References in the specification to "one embodiment," "an embodiment," "an exemplary embodiment," "some embodiments," etc., indicate that the embodiment described may include a particular feature, structure, or characteristic, but not every embodiment necessarily includes the particular feature, structure, or characteristic. Moreover, such phrases do not necessarily refer to the same embodiment.

Further, when a particular feature, structure or characteristic is described in connection with an embodiment, it would be within the knowledge of a person skilled in the art to affect such feature, structure or characteristic in connection with other embodiments whether or not explicitly described. A person of ordinary skill in the art can make modifications to the described embodiments according to the principle of the present disclosure. For example, one or more components of the disclosed device can be omitted or one or more components not explicitly described above can be added to the device. Similarly, one or more steps in the disclosed method can be omitted or one or more steps not explicitly described above can be included in the method.

Unless otherwise defined, all technical and scientific terms used in this disclosure have the same or similar meanings as generally understood by those having ordinary skill in the art. As described herein, the terms used in the specification of the present disclosure are intended to describe example embodiments, instead of limiting the present disclosure. In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," may be understood to convey a singular usage or to convey a plural usage, depending at least in part upon context.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. The terms "vertical," "horizontal," "up," "down," "left," "right," "perpendicular," "parallel," and similar expressions used herein, are merely intended for purposes of description. For example, phrases indicating directions, such as "vertical," "horizontal," "up," "down," "left," and "right," are to be understood as indicating the directions in the drawings with the orientation shown therein. The term "and/or" used herein includes any suitable combination of one or more related items listed.

In this disclosure, a value or a range of values may refer to a desired, target, or nominal value or range of values and can include slight variations. The term "about" or "approximately" associated with a value can allow a variation within, for example, 10% of the value, such as ±2%, ±5%, or ±10% of the value, or another proper variation as appreciated by those having ordinary skill in the art. The term "about" or "approximately" associated with a state can allow a slight deviation from the state. For example, a first component being approximately perpendicular to a second component can indicate that the first component is either exactly perpendicular to the second component or slightly deviates from being perpendicular to the second component, and an angle between the first and second components can be within a range from, e.g., 80° to 100°, or another proper range as appreciated by those having ordinary skill in the art.

FIGS. 1-6 are cross-sectional views showing certain processes during fabrication of an example semiconductor device. FIGS. 1-6 only show a portion of the semiconductor device. The semiconductor device can be, e.g., a memory device, such as a three-dimensional (3D) NAND-type memory device.

At the stage shown in FIG. 1, a memory cell wafer 100 (also referred to as a "memory wafer" or a "first wafer") having various memory structures is flipped over and bonded to a control circuit wafer 200 (also referred to as a "circuit wafer" or a "second wafer"). In this disclosure, the combination of the memory cell wafer 100 and the control circuit wafer 200 or a portion of such combination is also referred to as a "processing wafer." The processing wafer at any stage of the fabrication process of the semiconductor device can still be referred to as a processing wafer. The memory cell wafer 100 is has a staircase structure region (also referred to as an "SS region," as indicated in FIG. 1) and a memory cell array region (also referred to as a "core region," as indicated in FIG. 1).

The memory cell wafer 100 includes a substrate 101 carrying the various memory structures. The various memory structures can be formed by, for example, deposition, photolithography, implantation, etching, etc. In this disclosure, a memory structure refers to a structure or a component that constitutes a part of a memory device, and can be, e.g., as simple as a single layer, or a structure or composite layer formed by multiple layers of same/different materials having same/similar/different properties. The substrate 101 can be a growth substrate on which the various memory structures are grown or formed, and then flipped over and bonded to the control circuit wafer 200. The substrate 101 can be formed of one or more suitable semiconductor materials, such as silicon (Si), germanium (Ge), silicon germanium (SiGe), indium phosphide (InP), gallium arsenide (GaAs), gallium nitride (GaN), or silicon carbide (SiC), or a combination of suitable semiconductor and insulation materials, such as silicon on insulator (SOI). Further, the substrate 101 can be single crystalline or part of the substrate 101 may be amorphous or polycrystalline.

In the example shown in FIGS. 1-6, the memory cell wafer 100 includes a dielectric layer 102 formed on the substrate 101 and a conductor layer 103 formed on the dielectric layer 102. The dielectric layer 102 can include one or more dielectric materials, such as one or more of silicon oxide, silicon nitride, and silicon oxynitride. The conductor layer 103 is also referred to as a "bottom conductor layer" and can include, for example, polycrystalline silicon (polysilicon).

The various memory structures include a plurality of conductor layers 104 (also referred to as "gate conductor layers") and dielectric layers 105 (also referred to as "inter-conductor dielectric layers" or "inter-metal dielectric layers") alternately arranged in a vertical direction in FIGS. 1-6. At least some of the conductor layers 104 are each sandwiched by two neighboring dielectric layers 105, and at least some of the dielectric layers 105 are each sandwiched by two neighboring conductor layers 104. A pair of neighboring conductor layer 104 and dielectric layer 105 is also referred to as a conductor/dielectric tier. The conductor layers 104 can include one or more conductor materials, such as one or more of tungsten (W), cobalt (Co), copper (Cu), aluminum (Al), doped silicon, and silicides. The dielectric layers 105 can include one or more dielectric materials, such as one or more of silicon oxide, silicon nitride, and silicon oxynitride.

The plurality of conductor layers 104 and dielectric layers 105 extend horizontally (in the orientation shown in FIGS. 1-6) across the SS region and the core region. In the SS region, the conductor layers 104 are formed in a way that they become shorter one after another in the direction away from the substrate 101, forming a staircase-like structure. The various memory structures further include a plurality of word line contacts 106 in the SS region and the word line contacts 106 extend in the vertical direction. Each of the plurality of word line contacts 106 can electrically couple one of the conductor layers 104 to a control device (such as a transistor) in the control circuit wafer 200.

The various memory structures can further include, for example, channel holes (CHs) filled with suitable material(s) and gate line slits (GLSs) filled with suitable material(s). For simplicity of description, in this disclosure, a CH filled with material(s) is also referred to as a CH and a GLS filled with material(s) is also referred to as a GLS. The CHs and the GLSs can penetrate some or all of the conductor layers 104 and the dielectric layers 105. A CH can be electrically coupled to a control device (such as a transistor) in the control circuit wafer 200.

In FIGS. 1-6, three CHs 110 and one GLS 120 are shown in the core region of the memory cell wafer 100. The memory cell 100 can include more CHs and GLSs in the core region thereof. There are also structures similar to CHs and GLSs in the SS region of the memory cell wafer 100 but they are dummy structures and do not serve the same function as their counterparts in the core region.

A CH 110 can have a pillar or column shape, and includes a channel layer 112 and a memory film 114 surrounding the channel layer 112. The memory film 114 can cover a sidewall and a top surface of the channel layer 112. The channel layer 112 can include a semiconductor material, such as silicon (e.g., amorphous silicon, polycrystalline silicon, or single crystalline silicon), and can be doped with a suitable dopant. The memory film 114 is configured to store data by, for example, storing electric charges, such as electrons. The memory film 114 can be formed of one or more suitable materials such as one or more of silicon nitride, silicon oxide, silicon oxynitride, silicon, and high dielectric constant (high-k) materials. In some embodiments, the memory film 114 can include a composite layer including a tunneling layer, a storage layer (also referred to as a "charge trap/storage layer"), and a blocking layer arranged in this order from a side of the memory film 114 proximal to the channel layer 112 toward a side proximal to the conductor layers 104 and the dielectric layers 105. The tunneling layer, the storage layer, and the blocking layer can be formed of a same dielectric material or different dielectric materials. For example, the tunneling layer can include at least one of silicon oxide or silicon nitride, the storage layer can include at least one of silicon nitride, silicon oxynitride, or silicon, and the blocking layer can include at least one of silicon oxide, silicon nitride, or a high-k material. As an example, the memory film 114 can have an ONO (silicon oxide/silicon nitride/silicon oxide) structure, with the silicon nitride layer being the storage layer. In some embodiments, as shown in, e.g., FIG. 1, the CH 110 further includes a filling layer 116 buried in the channel layer 112. The filling layer 116 can be formed of one or more dielectric materials such as one or more of silicon nitride, silicon oxide, and silicon oxynitride.

A portion of a conductor layer 104 close to a CH 110, together with a corresponding portion of the memory film 114 and a corresponding portion of the channel layer 112 of the CH 110 that are close to that portion of the conductor layer 104, form a memory cell of the memory cell wafer 100. In this memory cell, the portion of the conductor layer 104 can function as a gate, such as a control gate. The plurality of memory cells corresponding to a same CH 110 form a memory string arranged in the vertical direction. For a NAND type memory device, the memory string can be a NAND string.

A GLS 120 also can have a pillar or column shape, and includes a conductor layer 122 (also referred to as a "GLS conductor layer") and a dielectric layer 124 (also referred to as a "GLS dielectric layer") surrounding the conductor layer 122. The dielectric layer 124 can cover a sidewall and a top surface of the conductor layer 122. The conductor layer 122 can include a conductor material, such as silicon (e.g., amorphous silicon, polycrystalline silicon, or single crystalline silicon), and can be doped with a suitable dopant. The dielectric layer 124 can be formed of one or more dielectric materials such as one or more of silicon nitride, silicon oxide, silicon oxynitride, and high dielectric constant (high-k) materials. In some embodiments, the conductor layer 122 can be formed of a same or similar material as the channel layer 112, such as silicon. In some embodiments, the dielectric layer 124 can be formed of a material similar to at least one material forming the memory film 114, such as silicon oxide. In this disclosure, two materials being similar to each other refers to that the two materials have similar properties and/or have same or similar chemical composition with a slight difference in terms of other properties, such as crystal structure and doping level. For example, two layers both made of polysilicon but having different doping levels can be considered as including similar material.

In the example shown in FIG. 1, the memory cell wafer 100 further includes an etch stop layer 130 between the substrate 101 and the plurality of conductor layers 104 and dielectric layers 105, and a sacrificial layer 140 between the substrate 101 and the etch stop layer 130. The etch stop layer 130 can be formed of a same or similar material as that used for the channel layer 112, such as polysilicon, or be formed of a different material than that used for the channel layer 112, as long as the etching by an etchant can be stopped at both the etch stop layer 130 and the channel layer 112 (as described in more detail later). The sacrificial layer 140 can be formed of one or more materials that are used for the memory film 114, such as silicon oxide.

The control circuit wafer 200 can include various circuits formed at a substrate (also referred to as a "carrier substrate") and the circuits are configured to control the operation of the final semiconductor device. The circuits can include different types of transistors, such as N-type metal-oxide-semiconductor (NMOS) transistors and/or P-type MOS (PMOS) transistors. The transistors can form, e.g., complementary MOS (CMOS) logic circuits. The circuits can also include various wirings coupling the transistors.

Figure 2:
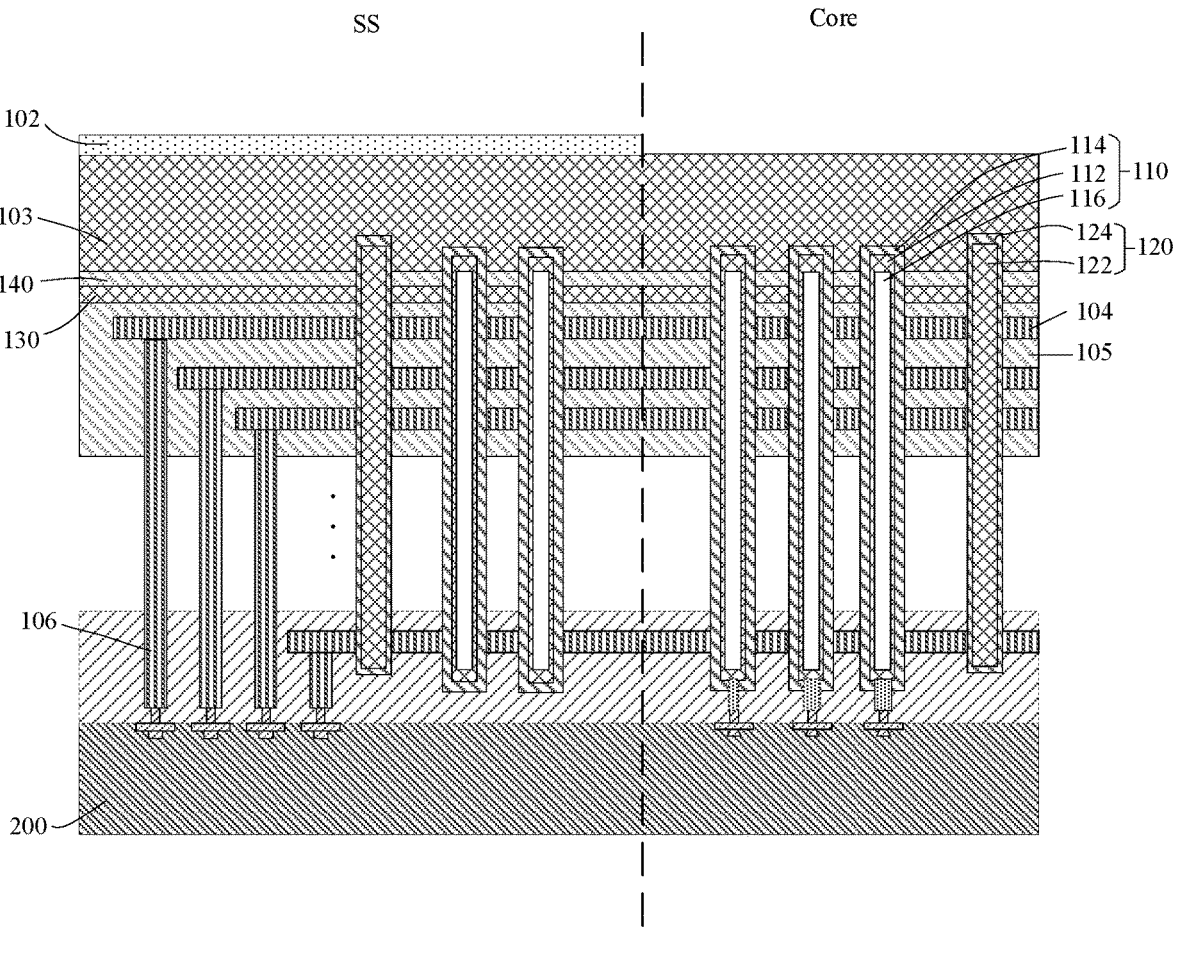
FIG. 2 is a schematical cross-sectional diagram showing a certain stage of the method of fabricating the semiconductor device consistent with the disclosure.

After the memory cell wafer 100 is bonded to the control circuit wafer 200, the substrate 101 is removed, as shown in FIG. 2. The substrate 101 can be removed by, for example, polishing (such as chemical-mechanical polishing (CMP)) and/or etching (such as dry etching and/or wet etching). Then, the dielectric layer 102 is patterned to remove the portion in the core region with the portion in the SS region being left, as shown in FIG. 2. The dielectric layer 102 can be patterned by photolithography and etching. The etching to remove the core region portion of the dielectric layer 102 can be a selective etching using an etchant having a high selectivity over the material of the conductor layer 103 such that the etching can stop at the top of the conductor layer 103 or only etch a small amount of the conductor layer 103. In some embodiments, after the etching is completed, any photoresist used during patterning of the dielectric layer 102 can be removed by, e.g., ashing. The patterned dielectric layer 102 can serve as a mask in the subsequent etching process.

Figure 3:
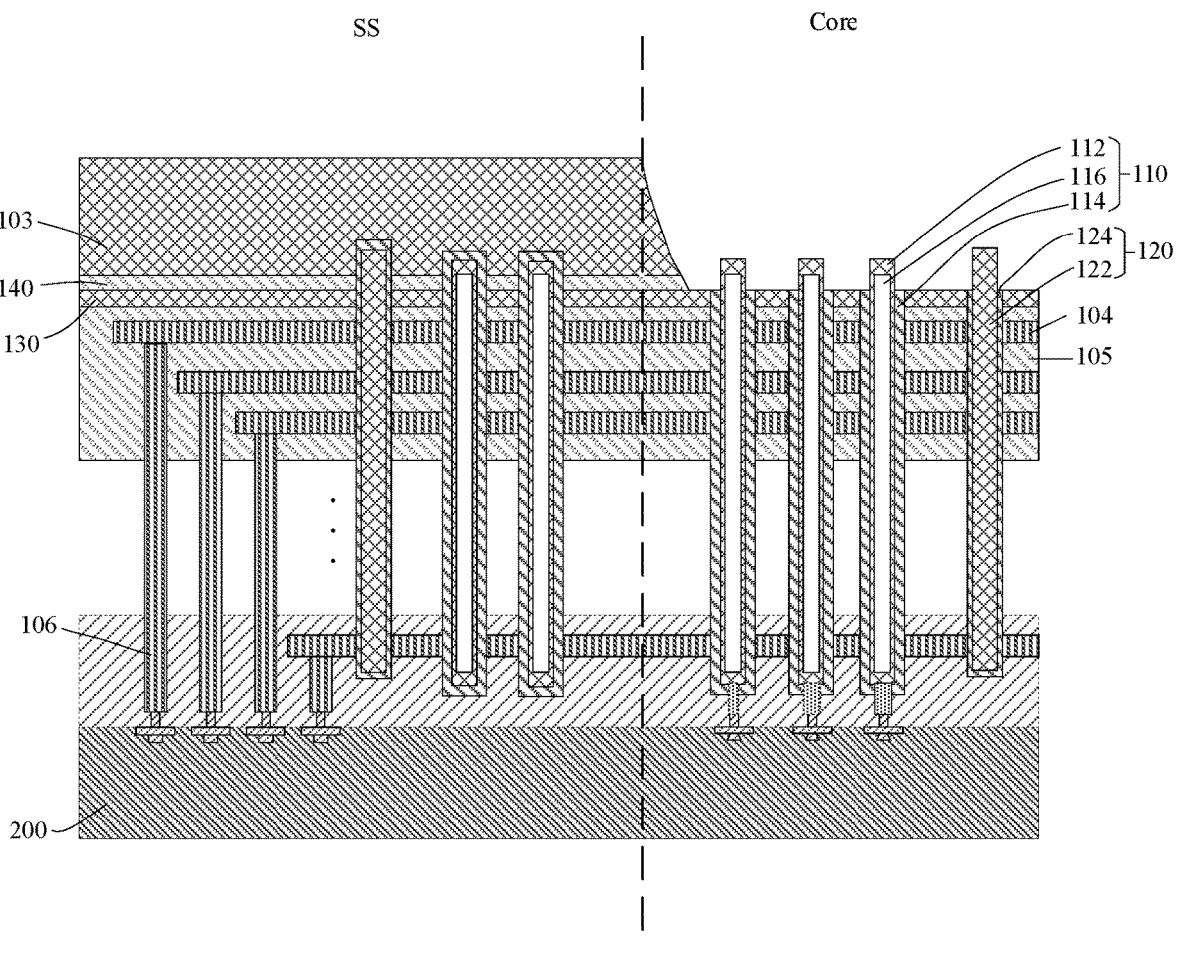
FIG. 3 is a schematical cross-sectional diagram showing a certain stage of the method of fabricating the semiconductor device consistent with the disclosure.

Once the conductor layer 103 in the core region is exposed, etching can be performed using the patterned dielectric layer 102 as a mask to remove the portion of the conductor layer 103 and the portion of the sacrificial layer 140 in the core region, as well as a portion of the memory film 114 of each CH 110 protruding from the etch stop layer 130 (i.e., not covered by the etch stop layer 130, such a portion of the memory film 114 is also referred to as a "protrusion portion" of the memory film 114) and a portion of the dielectric layer 124 of each GLS 120 protruding from the etch stop layer 130 (i.e., not covered by the etch stop layer 130, such a portion of the dielectric layer 124 is also referred to as a "protrusion portion" of the dielectric layer 124), as shown in FIG. 3.

Etching of the conductor layer 103 and the sacrificial layer 140 can include a multi-step selective etching. For example, in a first step of the multi-step selective etching, the conductor layer 103 can be etched by, e.g., dry etching or wet etching, to expose the sacrificial layer 140; and then in a second step of the multi-step selective etching, the sacrificial layer 140, the portion of each memory film 114 protruding from the etch stop layer 130, and the portion of each dielectric layer 124 protruding from the etch stop layer 130, can be etched, exposing the etch stop layer 130, a portion of each channel layer 112 protruding from the etch stop layer 130, and a portion of each conductor layer 122 protruding from the etch stop layer 130. Further, as shown in FIG. 3, because the SS region is covered by the remaining portion of the conductor layer 103, the portion of the sacrificial layer 140 and the dummy structures (those similar to the CHs 110 and GLS 120) in the SS region can remain intact.

Depending on the material/structure of the memory film 114 and/or the material/structure of the dielectric layer 124, as well as the choice of etchant, the second step in the multi-step etching above can also itself be multi-step etching. For example, the memory film 114 can include an oxide-nitride-oxide (ONO) composite film and the sacrificial layer 140 can include an oxide film. In this example, multi-step selective etching can be used to etch the ONO composite film layer-by-layer, or single-step etching using an etchant that can etch both oxide and nitride can be used. As long as the etching method can remove the exposed portions of the sacrificial layer 140, the memory films 114, and the dielectric layers 124 and can stop at the etch stop layer 130, the channel layers 112, and the conductor layers 122, such etching method can be used in this step.

In some embodiments, after the channel layers 112 are exposed, an impurity implantation is performed. The impurities implanted in this process can be same or similar impurities that serve as the dopant in the channel layers 112. In some embodiments, the channel layers 112 include poly-silicon doped with an N-type dopant, such as phosphorus (P), arsenic (As), or antimony (Sb). Correspondingly, the impurities implanted in this process can be impurities that can serve as N-type dopant in silicon, such as P, As, or Sb. This impurity implantation can increase the carrier concentration (doping level) in the exposed portions of the channel layers 112. The exposed portion of a channel layer 112, which protrudes above the etch stop layer 130 and is also referred to as a "protrusion portion" of the channel layer 112, will serve as a bottom select source (BSS). To realize the gate induced drain leakage (GIDL) erasure or improve the efficiency of the GIDL erasure during operation of the semiconductor device as a memory device, the doping level in the BSS may need to be higher than that in the channels of corresponding memory cells in the same memory string, i.e., other portions of the corresponding channel layer 112. The above impurity implantation to increase the doping level in the exposed portions of the channel layers 112 is also referred to as a "GIDL implantation." The implanted impurities may need to be activated by, e.g., laser activation, as will be described in more detail later.

Figure 4:
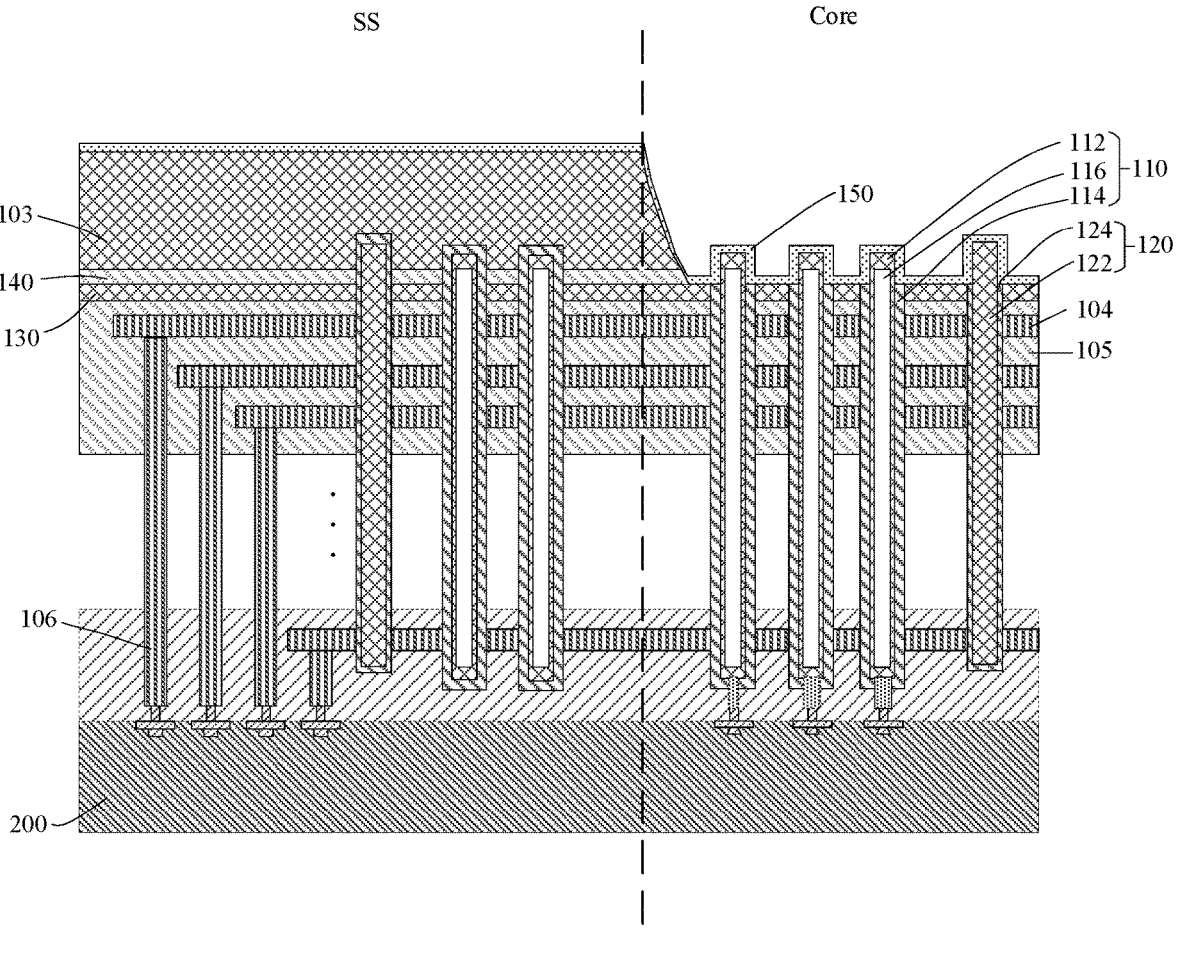
FIG. 4 is a schematical cross-sectional diagram showing a certain stage of the method of fabricating the semiconductor device consistent with the disclosure.

Consistent with the disclosure, a blank deposition of a semiconductor material can be performed to form a thin semiconductor layer 150 over the exposed surface of the entire structure, as shown in FIG. 4. Since the semiconductor layer 150 is thin, as shown in FIG. 4, the semiconductor layer 150 can have a profile approximately following the top profile of the entire structure, such as those of the remaining portion of the conductor layer 103, the protrusion portions of the channel layers 112, and the protrusion portion of the conductor layer 122.

The deposition can be performed with both the semiconductor material and impurities such that the thin semiconductor layer 150 can be doped with the impurities. In some embodiments, the semiconductor material forming the semiconductor layer 150 can include a material same as or similar to the material of the channel layers 112, but may be in a non-crystalline form, such as amorphous silicon or polysilicon. The impurities doped in the semiconductor layer 150 can be same as or similar to the dopant in the channel layers 112, such as P, As, or Sb. In some embodiments, the semiconductor material can be deposited using a low temperature deposition method, such as a low temperature chemical vapor deposition (CVD) method, at a temperature lower than, e.g., 400° C., forming a layer of amorphous silicon as the semiconductor layer 150.

In the embodiments described above, the GIDL implantation is performed before the deposition to form the semiconductor layer 150. In some other embodiments, the GIDL implantation can be performed after the semiconductor layer 150 is formed, as long as the implanted impurities can reach the protrusion portions of the channel layers 112 that will serve as the BSS.

Figure 5:
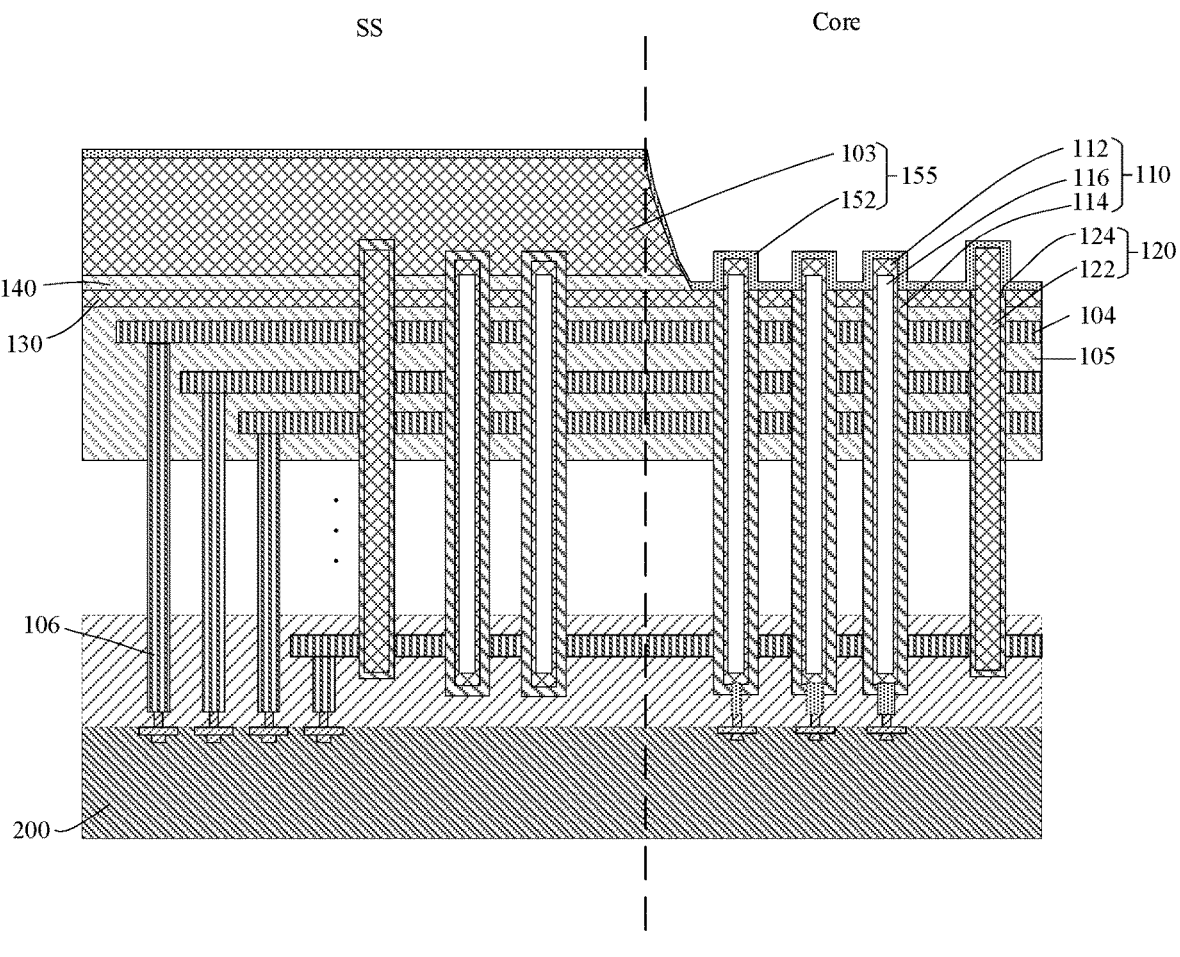
FIG. 5 is a schematical cross-sectional diagram showing a certain stage of the method of fabricating the semiconductor device consistent with the disclosure.

After the GIDL implantation and the deposition to form the semiconductor layer 150, laser activation is performed to activate the impurities implanted into the protrusion portions of the channel layers 112. In some embodiments, in addition to activating impurities in the protrusion portions of the channel layers 112, the laser activation can also activate the impurities in the semiconductor layer 150, making the semiconductor layer 150 more conductive. In some embodiments, the laser activation can also modify the property and/or structure (such as crystal structure) of the semiconductor layer 150, converting it to a modified semiconductor layer 152, as shown in FIG. 5. For example, the material forming the semiconductor layer 150 can include amorphous silicon, and the laser activation can also cause the deposited amorphous silicon to crystallize, converting the amorphous silicon into polysilicon. Since the material of the semiconductor layer 150 (and hence the modified semiconductor layer 152) is same as or similar to that of the channel layers 112 and that of the conductor layer 122, the portion of the modified semiconductor layer 152 surrounding a channel layer 112 can also be considered as and function as part of the channel layer 112, and similarly the portion of the modified semiconductor layer 152 surrounding a conductor layer 122 can also be considered as and function as part of the conductor layer 122. Further, the modified semiconductor layer 152 can be electrically coupled to the conductor layer 103 and together constitute a conductive film 155. The semiconductor layer 103 can also be referred to as a first conductive layer of the conductive film 155 and the modified semiconductor layer 152 can also be referred to as a second conductive layer of the conductive film 155.

Depending on the parameters of the laser activation, such as wavelength of the laser, power of the laser, and the duration of the laser activation, a portion of the conductor layer 103 and/or portions of the etch stop layer 130 that are adjacent to the semiconductor layer 150 can also be affected by the laser activation and become parts of the modified semiconductor layer 152. For example, both the conductor layer 103 and the etch stop layer 130 can include polysilicon, and the laser activation can have an energy high enough or a duration long enough to also melt portions of the conductor layer 103 and the etch stop layer 130 that are adjacent to the semiconductor layer 150, and the melt portion can later recrystallize to form recrystallized polysilicon. In some embodiments, the method of forming the conductor layer 103 and the etch stop layer 130 can be different from the method of forming the modified semiconductor layer 152. Therefore, even the modified semiconductor layer 152 can have a same or similar material, such as polysilicon, as the conductor layer 103 and the etch stop layer 130, a boundary can still exist between the modified semiconductor layer 152 and the remaining portions of the conductor layer 103 and the etch stop layer 130 because their structures may be different.

In some embodiments, the laser source used for the laser activation can be a continuous wave laser or a pulsed laser. In some embodiments, the laser can have a short wavelength, such as a wavelength in the UV range. The present disclosure does not limit the type and characteristics of the laser source. Persons of ordinary skill in the art can choose the proper laser source according to the actual situation and need.

Figure 6:
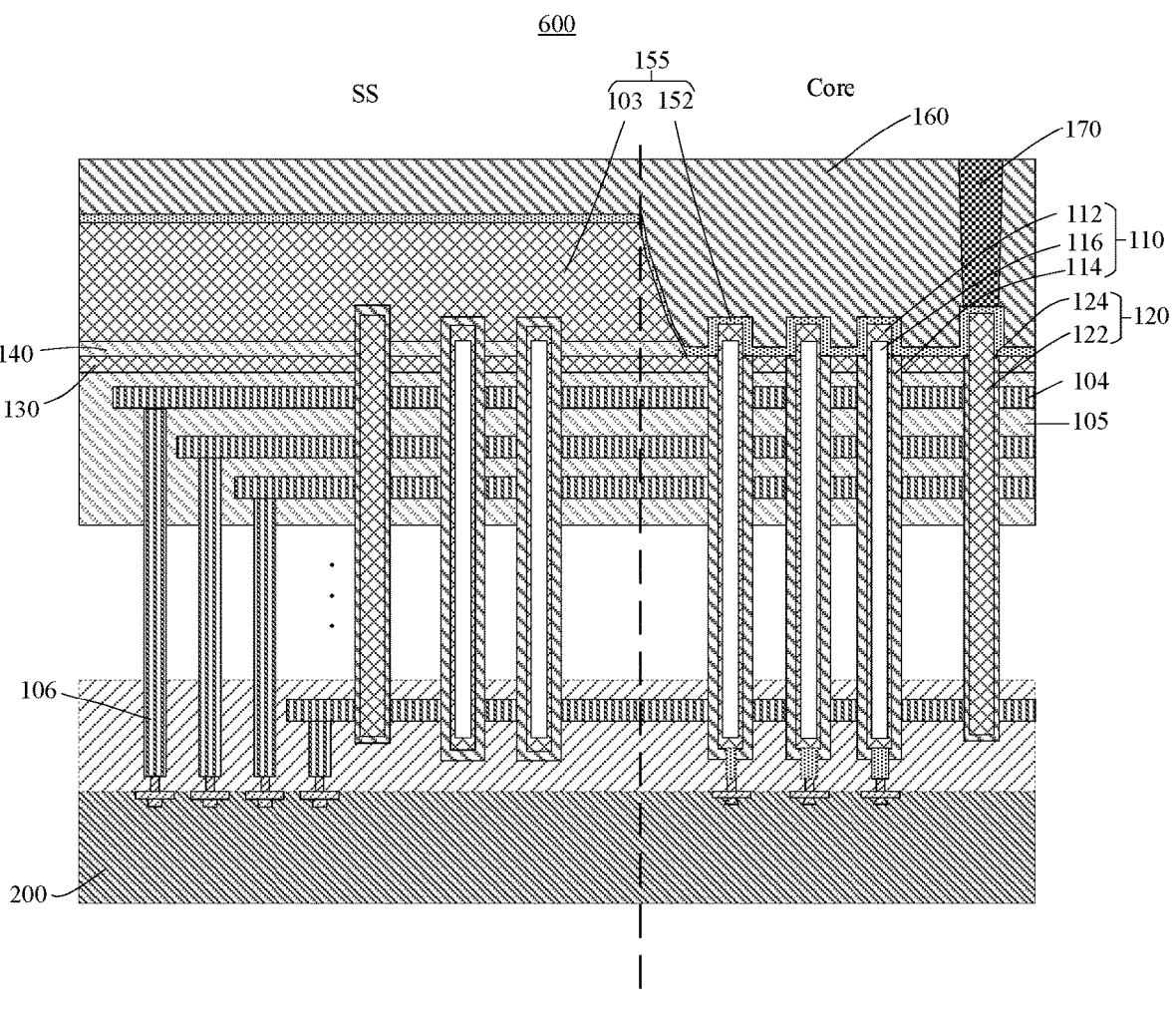
FIG. 6 is a schematical cross-sectional diagram showing a certain stage of the method of fabricating the semiconductor device consistent with the disclosure, and a portion of the semiconductor device consistent with the disclosure.

After the laser activation is performed, a dielectric material is deposited over the entire structure to form a dielectric layer 160 (also referred to as a "cap dielectric layer"). The dielectric material can include, for example, silicon oxide deposited by low pressure chemical vapor deposition (LPCVD) using tetraeythlorthosilicate (TEOS) as silicon source. In some embodiments, because of the step between the SS region and the core region (as shown in, e.g., FIG. 5), the deposited dielectric layer 160 can also have a step between the SS region and the core region, and a planarization process (including, for example, CMP and/or etching) can be performed to planarize the dielectric layer 160, resulting in a flat top surface of the dielectric layer 160, as shown in FIG. 6. Patterning can be performed to form a through hole in the dielectric layer 160 to expose the top surface of a portion of the modified semiconductor layer 152 over the conductor layer 122 of the GLS 120. A conductor material, such as polysilicon, can be deposited in the through hole to form a contact structure 170 (also referred to as a "pickup"), as shown in FIG. 6, for electrical coupling with other components of the semiconductor device formed in subsequent processes. The conductivity type of the contact structure 170 can depend on the conductivity type of the conductor layer 122, and can be, for example an N-type pickup when the conductor layer 122 includes N-type doped polysilicon.

Other processes for forming the final semiconductor device, such as wiring and packaging, can be further performed, descriptions of which are omitted here.

The present disclosure also provides a semiconductor device. FIG. 6 schematically shows a portion of a semiconductor device 600 consistent with the disclosure. The semiconductor device 600 can be, e.g., a memory device, such as a three-dimensional (3D) NAND-type memory device. As indicated in FIG. 6, the semiconductor device 600 can have a core region where a plurality of memory cells (memory units) are formed and an SS region where a plurality of vertical contacts are formed.

As shown in FIG. 6, the semiconductor device 600 includes the circuit wafer 200, which includes a substrate (carrier substrate) and a plurality of circuits formed at the substrate (carrier substrate). The plurality of circuits can be configured to control the operation of the semiconductor device 600, and can include different types of transistors and various wiring coupling the transistors.

The semiconductor device 600 further includes one or more conductor/dielectric tiers over the circuit wafer 200. Each conductor/dielectric tier includes a conductor layer 104 and a dielectric layer 105. One or more CHs 110 and one or more GLS 120 are formed in the core region and penetrate the one or more conductor/dielectric tiers. A CH 110 includes a channel layer 112 and a memory film 114 surrounding the channel layer 112. A portion (protrusion portion) of the channel layer 112 at a top of the CH 110 and protruding above the conductor/dielectric tiers is exposed from the memory film 114, i.e., not covered by the memory film 114. That is, the memory film 114 can cover the sidewall of a lower portion of the channel layer 112 (also referred to as a "first portion" of the channel layer 112), but does not cover the top surface of the channel layer 112 and the sidewall of a top portion of the channel layer 112 (i.e., the protrusion portion of the channel layer 112, also referred to as a "second portion" of the channel layer 112). Similarly, a GLS 120 includes a conductor layer 122 and a dielectric layer 124 surrounding the conductor layer 122. A portion (protrusion portion) of the conductor layer 122 at a top of the GLS 120 and protruding above the conductor/dielectric tiers is exposed from the dielectric layer 124, i.e., not covered by the dielectric layer 124. That is, the dielectric layer 124 can cover the sidewall of a lower portion of the conductor layer 122 (also referred to as a "first portion" of the conductor layer 122), but does not cover the top surface of the conductor layer 122 and the sidewall of a top portion of the conductor layer 122 (i.e., the protrusion portion of the conductor layer 122, also referred to as a "second portion" of the conductor layer 122). Dummy structures similar to the CH 110 and the GLS 120 can also be formed in the SS region, except that in a dummy CH structure the top portion of the channel layer can still be covered by the memory film and in a dummy GLS structure the top portion of the conductor layer can still be covered by the dielectric layer.

As shown in FIG. 6, the semiconductor device 600 further includes a conductive film 155 over the one or more conductor/dielectric tiers. The conductive film 155 includes a first conductive layer, i.e., the conductor layer 103, in the SS region, and a second conductive layer, i.e., the modified semiconductor layer 152 across the SS region and the core region and arranged over the first conductive layer in the SS region. That is, the second conductive layer includes a first portion in the SS region and a second portion in the core region, and the first portion of the second conductive layer covers the first conductive layer.

As shown in FIG. 6, the second conductive layer can be much thinner than the first conductive layer. Therefore, the conductive film 155 can have a height difference between the portion in the SS region and the portion in the core region, i.e., having a step at the boundary between the SS region and the core region. In the core region, the second conductive layer can directly contact the protrusion portion of the channel layer 112 of each CH 110 and the protrusion portion of the conductor layer 122 of each GLS. Further, in the core region, the second conductive layer can surround the protrusion portion of the channel layer 112 of each CH 110 and can be in direct contact with the memory film of each CH. In contrast, in the SS region, the second conductive layer can be separated from the channel layer of each dummy CH structure and the conductor layer of each dummy GLS structure by the corresponding memory film and dielectric layer, as well as the first conductive layer.

Further, as shown in FIG. 6, the second conductive layer can have a conformal configuration across the core region and the SS region. That is, the second conductive layer can have an approximately uniform thickness, and follow the profiles of structures therebelow.

In some embodiments, as shown in FIG. 6, the semiconductor device 600 also includes the etch stop layer 130 and the sacrificial layer 140. The etch stop layer 130 is between the conductor/dielectric tiers and the conductive film 155, and extends across the SS region and the core region. The etch stop layer 130 can also surround each CH 110 and each GLS 120. The sacrificial layer 140 is between the conductor layer 103 and the etch stop layer 130, and can be only in the SS region. That is, the horizontal expansion of the sacrificial layer 140 can be approximately the same as that of the conductor layer 103.

In some embodiments, as shown in FIG. 6, the semiconductor device 600 further includes the dielectric layer 160 over the conductive film 155. The top of the dielectric layer 160 can be approximately flat. Thus, due to the step of the conductive film 155 at the boundary between the SS region and the core region, the thickness of the portion of the dielectric layer 160 in the SS region can be much smaller than the thickness of the portion of the dielectric layer 160 in the core region. In some embodiments, the semiconductor device 600 further includes the contact structure 170 formed in the dielectric layer 160 and contacting and electrically coupled to the modified semiconductor layer 152 at a portion thereof above the GLS 120.

For components of the semiconductor device 600, as well as characteristics of each component of the semiconductor device 600, that are not explicitly described, reference can be made to the description above regarding the fabrication method of the semiconductor device.

Consistent with the disclosure, GIDL implantation for implanting impurities into the protrusion portions of the channel layers 112 is performed after the portion of the conductor layer 103 in the core region is removed. The implantation can be performed with or without the thin semiconductor layer 150. Because the thickness of material layer covering the protrusion portions of the channel layers 112 in the core region is reduced, the length of the path that implanted impurities need to travel before reaching the protrusion portions of the channel layers 112 is shortened. As a result, implantation energy and/or implantation dosage can be reduced, implantation efficiency can be improved, and the implantation process can be more controllable.

Further, consistent with the disclosure, no planarization is needed before the laser activation process. The parameter window for the laser activation process can be broadened. As a result, the laser activation process can be more controllable and less faulty.

Figure 7:
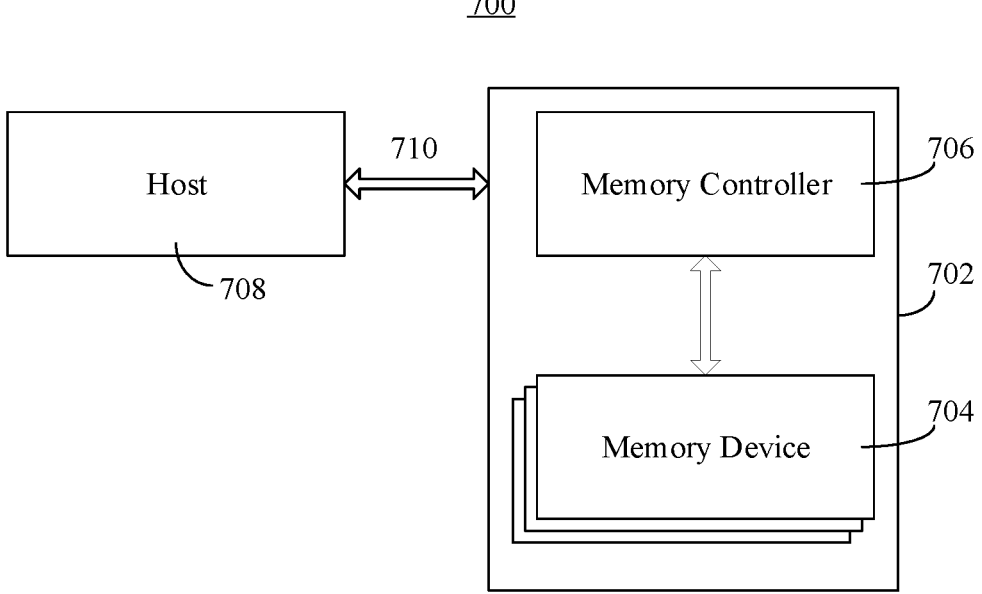
FIG. 7 is a block diagram of an example system consistent with the disclosure.

FIG. 7 is a block diagram of an example system 700 having a memory device consistent with the disclosure. The system 700 can be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. As shown in FIG. 7, the system 700 includes a host 708 and a memory system 702 having one or more memory devices 704 and a memory controller 706. The host 708 can be a processor of an electronic device, such as a central processing unit (CPU), or a system-on-chip (SoC), such as an application processor (AP). The host 708 can be configured to send or receive data to or from the one or more memory devices 704. Each of the one or more memory devices 704 can include a semiconductor device consistent with the disclosure, such as one of the example semiconductor devices described above.

The memory controller 706 is coupled to the one or more memory devices 704 and the host 708, and is configured to control the one or more memory devices 704, according to some implementations. The memory controller 706 can also be integrated into the one or more memory devices 704. The memory controller 706 can manage the data stored in the one or more memory devices 704 and communicate with the host 708 via an interface 710. In some embodiments, the memory controller 706 is designed for operating in a low duty-cycle environment, such as a secure digital (SD) card, a compact Flash (CF) card, a universal serial bus (USB) Flash drive, or another medium for use in electronic devices, such as personal computers, digital cameras, mobile phones, etc. In some other embodiments, the memory controller 706 is designed for operating in a high duty-cycle environment, such as a solid-state drive (SSD) or an embedded multi-media-card (eMMC) used as data storage for mobile devices, such as smartphones, tablets, laptop computers, etc., and enterprise storage arrays. The memory controller 706 can be configured to control operations of the one or more memory devices 704, such as read, erase, and program operations.

Figure 8:
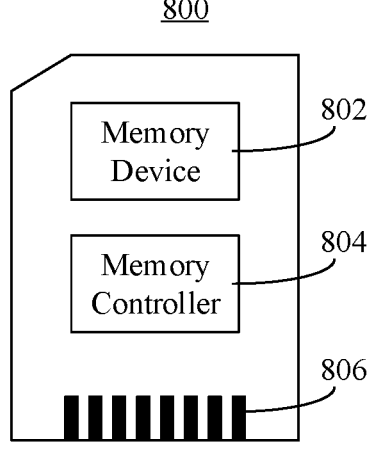
FIG. 8 is a block diagram of an example memory card consistent with the disclosure.
Figure 9:
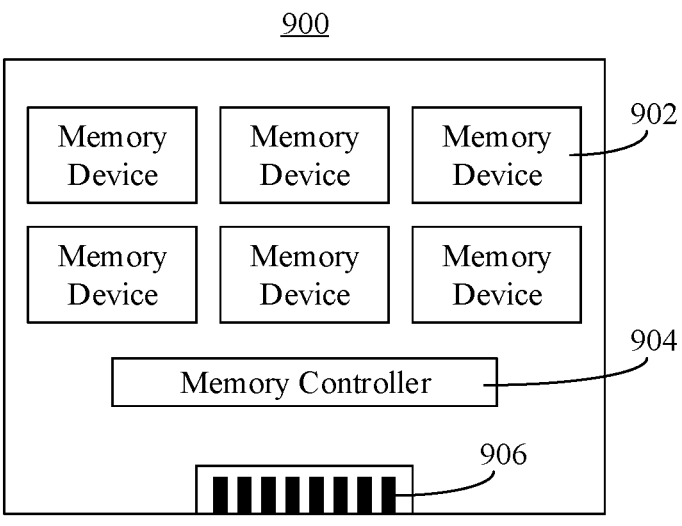
FIG. 9 is a block diagram of an example solid-state drive consistent with the disclosure.

The memory controller 706 and the one or more memory devices 704 can be integrated into various types of storage devices, for example, be included in the same package, such as a universal Flash storage (UFS) package or an eMMC package. That is, the memory system 702 can be implemented and packaged into different types of end electronic products. FIGS. 8 and 9 are block diagrams of an example memory card 800 and an example SSD 900, respectively, consistent with the disclosure. As shown in FIG. 8, a single memory device 802 and a memory controller 804 are integrated into the memory card 800. The memory device 802 can include a semiconductor device consistent with the disclosure, such as one of the above-described example semiconductor devices. The memory card 800 can include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. As shown in FIG. 8, the memory card 800 further includes a memory card interface or interface connector 806 configured to couple the memory card 800 to a host (e.g., the host 708 shown in FIG. 7).

As shown in FIG. 9, multiple memory devices 902 and a memory controller 904 are integrated into the SSD 900. Each of the memory devices 902 can include a semiconductor device consistent with the disclosure, such as one of the above-described semiconductor devices. As shown in FIG. 9, the SSD 900 further includes an SSD interface or interface connector 906 configured to couple the SSD 900 to a host (e.g., the host 708 shown in FIG. 7).

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device comprising:
one or more conductor/dielectric tiers over a carrier substrate;
a conductive film over the one or more conductor/dielectric tiers, a thickness of the conductive film in a core region of the semiconductor device being smaller than a thickness of the conductive film in a staircase structure (SS) region of the semiconductor device; and
a channel hole (CH) in the core region and extending approximately vertically through the one or more conductor/dielectric tiers, the CH including:
a channel layer extending approximately vertically and including
a first portion in the one or more conductor/dielectric tiers, and
a second portion on the first portion, wherein the second portion of the channel layer is enveloped by the conductive film in the core region; and a memory film covering a sidewall of the channel layer.

2. The semiconductor device of claim 1, further comprising:
a dielectric layer over the conductive film, a top surface of the dielectric layer in the SS region being approximately flush with a top surface of the dielectric layer in the core region;
wherein the second portion of the channel layer extends into the dielectric layer.

3. The semiconductor device of claim 1, wherein the conductive film includes:
a first conductive layer in the SS region; and
a second conductive layer including
a first portion in the SS region covering the first conductive layer, and
a second portion in the core region enveloping the second portion of the channel layer.

4. The semiconductor device of claim 3, wherein a thickness of the second conductive layer is smaller than a thickness of the first conductive layer.

5. The semiconductor device of claim 3, wherein the second portion of the second conductive layer covers a sidewall of the second portion of the channel layer.

6. The semiconductor device of claim 1, further comprising:
a plurality of circuits between the carrier substrate and the one or more conductor/dielectric tiers, the plurality of circuits being configured to control an operation of the semiconductor device.

7. The semiconductor device of claim 1, further comprising:
a word line contact vertically connecting to a corresponding conductor of the one or more conductor/dielectric tiers, wherein
the conductive film is formed over the one or more conductor/dielectric tiers on a side opposite to the word line contact.

8. The semiconductor device of claim 1, further comprising:
a filling layer enclosed by the channel layer in the channel hole, wherein the filling layer is also enveloped by the conductive film.

9. The semiconductor device of claim 2, wherein:
the dielectric layer over the conductive film has a thickness in the core region greater than a thickness in the SS region.

10. The semiconductor device of claim 3, wherein:
the second conductive layer of the conductive film is further formed on a sidewall of the first conductive layer of the conductive film, separating the first conductive layer from a dielectric layer.

11. The semiconductor device of claim 10, wherein:
the dielectric layer is formed over the second conductive layer of the conductive film in the SS region and the core region.

12. The semiconductor device of claim 1, wherein:
the conductive film is in direct contact with the memory film in the core region.

13. A memory system comprising:
a memory device including:
one or more conductor/dielectric tiers over a carrier substrate;
a conductive film over the one or more conductor/dielectric tiers, a thickness of the conductive film in a core region of the semiconductor device being smaller than a thickness of the conductive film in a staircase structure (SS) region of the semiconductor device; and
a channel hole (CH) in the core region and extending approximately vertically through the one or more conductor/dielectric tiers, the CH including:
a channel layer extending approximately vertically and including
a first portion in the one or more conductor/dielectric tiers, and
a second portion on the first portion, wherein the second portion of the channel layer is enveloped by the conductive film in the core region; and a memory film covering a sidewall of the channel layer; and
a memory controller configured to control operation of the memory device.

14. The memory system of claim 13, further comprising:
a dielectric layer over the conductive film, a top surface of the dielectric layer in the SS region being approximately flush with a top surface of the dielectric layer in the core region,
wherein the second portion of the channel layer extends into the dielectric layer.

15. The memory system of claim 14, wherein:
the dielectric layer over the conductive film has a thickness in the core region greater than a thickness in the SS region.

16. The memory system of claim 13, wherein the conductive film includes:
a first conductive layer in the SS region; and a second conductive layer including
>> a first portion in the SS region covering the first conductive layer, and
>> a second portion in the core region enveloping the second portion of the channel layer.

17. The memory system of claim 16, wherein a thickness of the second conductive layer is smaller than a thickness of the first conductive layer.

18. The memory system of claim 16, wherein:

the second conductive layer of the conductive film is further formed on a sidewall of the first conductive layer of the conductive film, separating the first conductive layer from a dielectric layer.

19. The memory system of claim 13, wherein the conductive film is in direct contact with the memory film in the core region.

20. The memory system of claim 13, further comprising:

a word line contact vertically connecting to a corresponding conductor of the one or more conductor/dielectric tiers, wherein the conductive film is formed over the one or more conductor dielectric tiers on a side opposite to the word line contact.

\* \* \* \* \*